United States Patent [19]
Smith et al.

[11] Patent Number: 5,410,510

[45] Date of Patent: Apr. 25, 1995

[54] PROCESS OF MAKING AND A DRAM STANDBY CHARGE PUMP WITH OSCILLATOR HAVING FUSE SELECTABLE FREQUENCIES

[75] Inventors: Scott E. Smith, Sugar Land; Duy-Loan T. Le, Missouri City; Kenneth A. Poteet, Sugar Land; Michael V. D. Ho, Houston, all of Tex.

[73] Assignee: Texas Instruments Inc., Dallas, Tex.

[21] Appl. No.: 131,067

[22] Filed: Oct. 4, 1993

[51] Int. Cl.$^6$ .............................................. G11C 7/00
[52] U.S. Cl. .................. 365/201; 365/222; 365/233; 365/226; 331/57; 327/113
[58] Field of Search .............. 365/201, 222, 225.7, 365/228, 233, 229, 226; 307/202.2, 522; 331/57

[56] References Cited

U.S. PATENT DOCUMENTS 5,081,380  1/1992  Chen ................................. 307/591
5,283,764  2/1994  Kim et al. ......................... 365/222

Primary Examiner—Eugene R. LaRoche
Assistant Examiner—F. Niranjan
Attorney, Agent, or Firm—William W. Holloway; Lawrence J. Bassuk; Richard L. Donaldson

[57] ABSTRACT

An oscillator (108) for a standby charge pump (102,104) in a dynamic random access memory part (30) includes a fuse (136). The fuse can be blown after testing the part while selecting redundant memory cells to reduce the frequency of the oscillator and obtain a lower power part. The oscillator (108) also drives the on-chip self-refresh circuits (106) that operate slower in response to the reduced frequency. Selecting redundant circuits also includes eliminating memory cells that pass the pause test, but by only a certain margin. Reducing the frequency of the oscillator driving the self-refresh circuits would otherwise cause failure of the cells that pass the pause test by only the certain margin. The oscillator circuit includes a ring of inverter stages (112) and a fused voltage bias circuit (110) generating one or another set of bias voltages (118,120) to the ring oscillator to alter its frequency of oscillation.

22 Claims, 4 Drawing Sheets

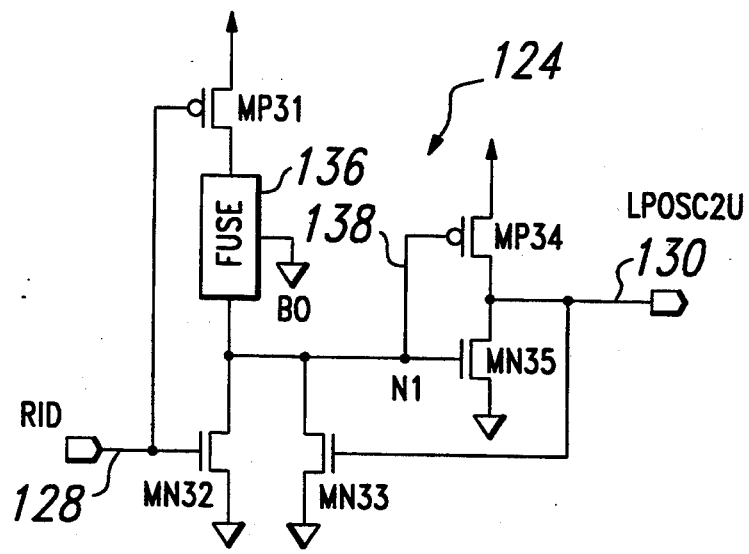
Fig. 4
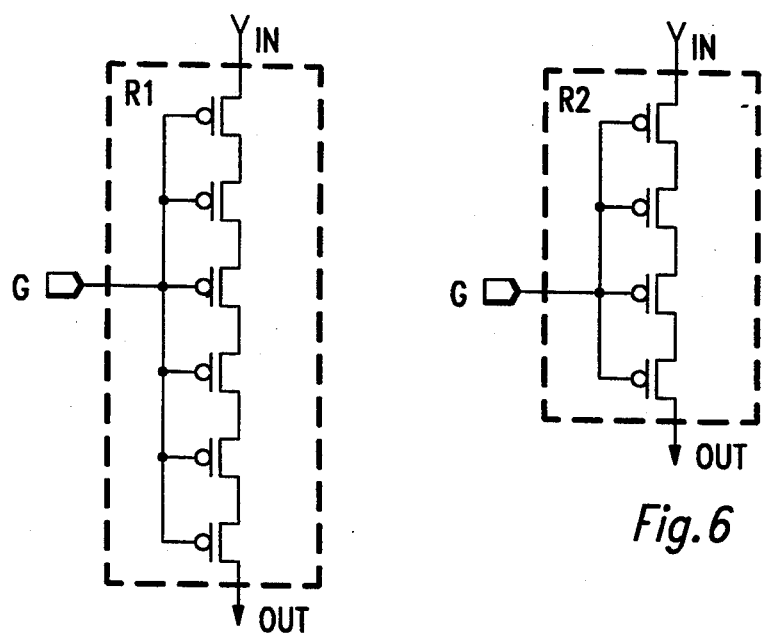
Fig. 5
Fig. 6

PROCESS OF MAKING AND A DRAM STANDBY CHARGE PUMP WITH OSCILLATOR HAVING FUSE SELECTABLE FREQUENCIES

FIELD OF THE INVENTION

This invention relates generally to a dynamic random access memory (DRAM) part having an oscillator that controls the operation of standby power circuits and self-refresh circuits, and particularly relates to such a part having an oscillator operating at one of plural frequencies the frequency being selected by a fuse after testing of the part.

DESCRIPTION OF THE RELATED ART

Dram parts contain many circuits that need more than one voltage for optimum operation. These voltages often become generated on the semiconductor chip carrying the circuits from a single voltage source of electrical power. In the past this single voltage has been 5 volts and more recently has become about 3 volts, the 3 volts being used in DRAM parts having 16,772,216 or 16M addressable storage locations.

These megabit DRAM parts often contain two main charge pumps, each producing a different voltage on the semiconductor chip, to operate the circuits on the part. Defects in the manufactured parts, resulting from variations in processing, often cause leakage currents to flow from components and leads coupled to the voltage sources therefor. Many of the semiconductor elements formed in the semiconductor material also exhibit some degree of leakage of current. To counter these leakage currents, standby charge pumps are added to maintain the correct voltage levels. These standby charge pumps are always active, but operate at a much lower frequency than the main charge pumps. The amount of standby current produced by the standby charge pumps is proportional to the frequency that is applied to the pumps and at which the pumps operate. Operating the standby charge pumps at higher frequencies adds to the standby current requirements and increases the standby current specifications of the part. This implementation runs counter to present market conditions that seek lower power parts.

SUMMARY OF THE INVENTION

The present invention seeks to reduce this standby current. If there are no abnormal defects in the semiconductor or circuit elements and no abnormal leakage paths, then the standby pumps could be reduced in size. This reduction would require changing the masks used to produce the parts. However, the size of the pumps can not be determined until after completing fabrication of the chip. Alternatively, the frequency of the oscillator driving the standby pumps can be adjusted. Prior to the present invention, no acceptable way existed for implementing such an adjustment because the oscillator is covered by the protective coatings applied on top of the chip at the final step of fabrication.

Reducing this standby current also effects a yield enhancement. DRAMs use dynamic storage cells that must be refreshed regularly to refresh the charge used to indicate the stored data. The stored charge leaks away from the cell over time, and due to semiconductor and process variations the leakage occurs over different lengths of time for different cells on the same chip. Thus data remains valid in different cells for different lengths of time. After fabrication, every DRAM chip is subjected to a pause test to ascertain the cells that fail to retain the stored charge for the time specified for that part. Rather than scraping the part, cells failing the pause test can be replaced with redundant cells to obtain improved yield. The pause test can also be used to ascertain the locations of cells that pass the pause test by less than a certain margin.

The oscillator that drives the standby charge pumps also drives the self-refresh circuits on the DRAM part. U.S. Pat. Nos. 4,207,618, 4,293,932 4,333,167 and 4,344,157 describe such self-refresh circuits. The frequency of that oscillator is selected to cause refresh of all cells within the refresh specification for that part. If the frequency driving the standby charge pumps and the self-refresh circuits becomes lowered, some cells that passed the pause test may not be refreshed within the time specified for the part and cause data failures. The designer can determine in advance the margin needed between the cells that just pass the pause test and the cells that would pass the pause test even at a reduced oscillator frequency. This margin becomes the certain margin previously mentioned.

The present invention recognizes that by placing a fuse in the oscillator driving the standby charge pumps, the frequency can be adjusted after testing by blowing the oscillator fuse at the same time as laser blowing of the fuses to select redundant memory cells. By also substituting redundant cells for the cells that pass the pause test by only the certain margin, the frequency of the oscillator can safely be reduced to obtain reduced standby current and also obtain refresh of all cells by the self-refresh circuits within the part. This procedure results in a part with lower standby current specifications than would have otherwise been available, increasing the yield of low power parts.

The oscillator for the standby charge pump includes a ring of inverter stages connected in a loop and a bias voltage circuit supplying a set of bias voltages to the ring of inverters. A fuse circuit selects generation of one or another set of bias voltages from a bias circuit. One set of bias voltages causes the ring of inverters to propagate pulses at one oscillator frequency and the other set of bias voltages causes the ring of inverters to propagate pulses at another oscillator frequency.

BRIEF DESCRIPTION OF THE DRAWINGS

FIG. 4 is a schematic diagram of the fuse circuit of FIG. 3;

FIG. 5 is a schematic diagram of one of the resistor circuits of FIG. 3;

FIG. 6 is a schematic diagram of the other resistor circuit of FIG. 3; and

DESCRIPTION OF THE PREFERRED EMBODIMENT

The present invention is used in a family of DRAM devices constructed and arranged to furnish one million words of sixteen parallel bits, also identified by the symbol 1M×16.

Figure 1:
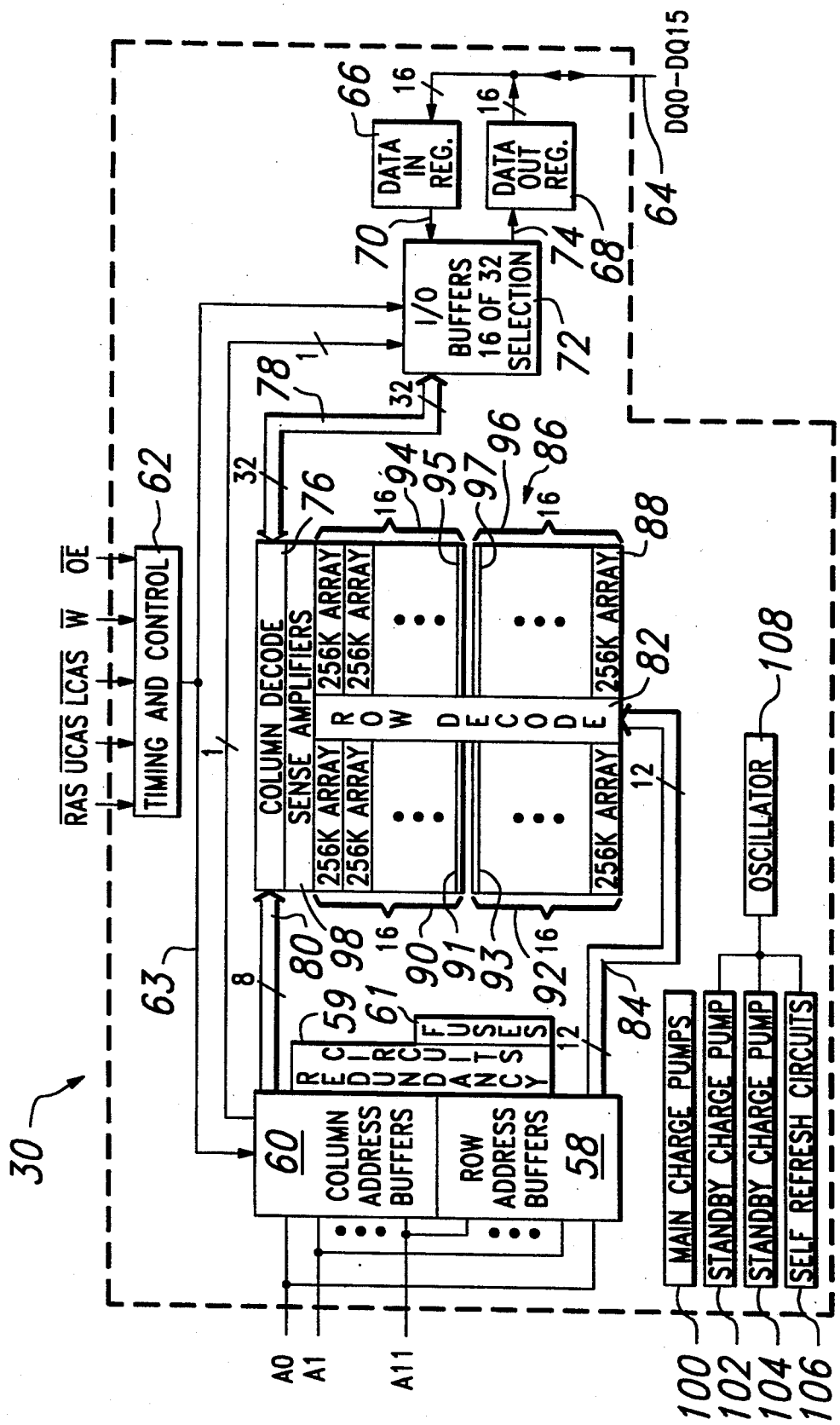
FIG. 1 is an idealized block diagram of a dynamic random access memory part including the present invention.

In FIG. 1, Dram part 30 receives address signals A0–A11 in row address buffers 58 and column address buffers 60. The address signals become latched in the address buffers by use of control signals: Row Address Strobe, RAS_, Upper Column Address Strobe, UCAS_, Lower Column Address Strobe, LCAS_, Write, W_ and Output Enable, OE_, received in timing and control block 62. Leads 63 carry desired timing and control signals from block 62 to buffers 58 and 60.

Redundancy circuits 59 and fuse circuits 61 connect with the address information received in row and column buffers 58 and 60 to select redundant rows and columns of memory cells for replacing defective memory cells after testing. The part is fabricated and then tested; repairable parts are acted upon by apparatus such as a laser that blows appropriate fuses in fuse circuits 61 and selects redundant rows and columns of memory cells to produce a saleable part.

Data signals DQ0–DQ15 are carried in parallel on leads 64 to data in register 66 and data out register 68. Sixteen data signals in parallel pass across leads 70 from data in register 66 to the 16 I/O buffers 72 and 16 data signals in parallel pass across data leads 74 from the 16 I/O buffers 72 to the data out register 68. Sixteen data signals in parallel pass from the I/O buffers 72 to the column decoders 76 across leads 78. The I/O buffers 72 also receive timing and control signals over leads 63 from timing and control block 62. Column decoders 76 receive 8 address signals in parallel across leads 80 from column address buffers 60. Row decoders 82 receive 12 address signals in parallel over leads 84 from row address buffers 58.

Column decoders 76 and row decoders 82 address individual memory cells in array 86, which includes 16,777,216 data bits configured in 1,048,576 (1M) words by 16 bits per word. Array 86 contains 64 subarrays, such as subarray 88, with each subarray containing 256K of data bits. Array 86 arranges the subarrays in four quadrants 90, 92, 94, and 96, with 16 subarrays in each quadrant. Each of the subarrays contain redundant memory cells arranged as redundant rows and redundant columns; these redundant memory cells are schematically represented at blocks 91, 93, 95, and 97. The redundant rows become selected by the row address signals received over leads 84 and the redundant columns become selected by the column address signals received over leads 80.

FIG. 1 depicts the subarrays in an idealized way between row decoders 82 and sense amplifiers 98. In the actual part, the row decoders can be arranged between the quadrants and the sense amplifiers can be located between the subarrays. The data signals from the selected rows of data bits in the array parts pass through the sense amplifiers 98 to column decoders 76.

Control signals Write, W_, and Output enable, OE_, connect to timing and control block 62 to indicate and control the writing and reading of data signals from overall array 86.

Please understand that this text uses an underline character following the name or acronym for a signal to indicate the active low state. This protocol facilitated text preparation using a word processor, even though the drawing may use an overscore to indicate the active low state.

DRAM part 30 also includes many other peripheral circuits to facilitate reading, writing and storage of data or information in part 30. Some of these circuits include main charge pumps 100 supplying electrical power at selected voltages, standby charge pump 102, standby charge pump 104 and self-refresh circuits 106. The standby charge pump 102 supplies current to the substrate at a voltage of Vbb, and standby charge pump 104 supplies current at a voltage of Vpp to compensate for leakage currents resulting from imperfections of processing and junction leakages of current. The self-refresh circuits 106 operate in a desired mode, described in the previously cited US patents, to cause refreshing of the dynamic memory cells without the need for the part to receive external row address signals. Oscillator circuits 108 operate at a selected frequency to operate both the two standby charge pumps and the self-refresh circuits.

Figure 2:
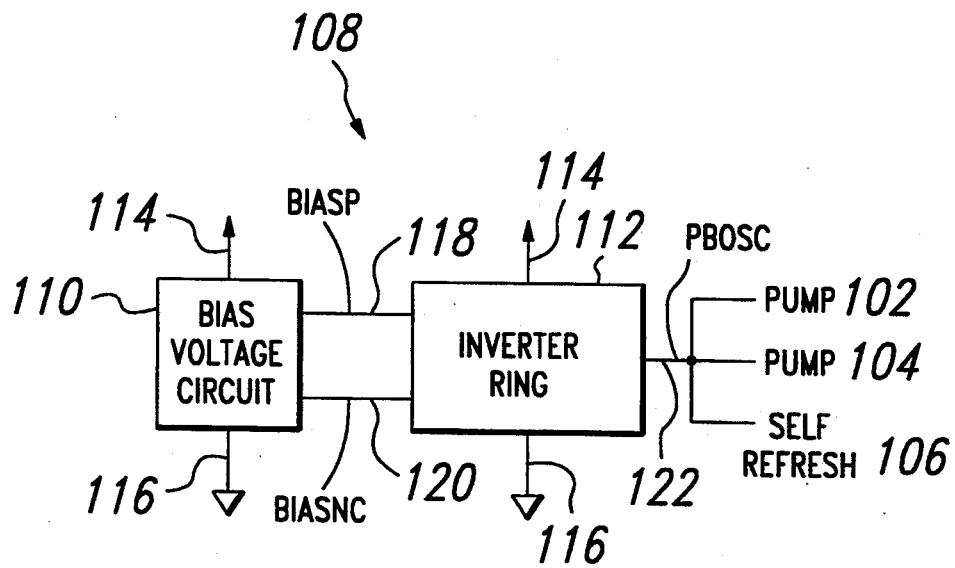
FIG. 2 is a block diagram of the oscillator of the present invention used for driving the standby charge pumps and self-refresh circuits.

In FIG. 2, oscillator 108 comprises a bias voltage circuit 110 and an inverter ring 112. Bias voltage circuit 110 and inverter ring 112 connect to Vdd through straight lines terminating in arrows 114 and connect to Vss through straight lines terminating in triangles 116. These symbols are universally used through this application to refer to Vdd and Vss. Bias voltage circuit 110 produces a set of bias voltages BIASP and BIASNC on leads 118 and 120 respectively to inverter ring 112. Inverter ring 112 in turn produces a signal PBOSC on lead 122 that extends out to standby charge pump 102, standby charge pump 104 and self-refresh circuits 106. The signal PBOSC forms a pulse signal used to drive the two standby charge pumps and the self-refresh circuits according to the frequency at which the inverter ring 112 oscillates. The frequency at which inverter ring 112 oscillates is determined by the set of bias voltages BIASP and BIASNC produced by the bias voltage circuit 110.

Figure 3:
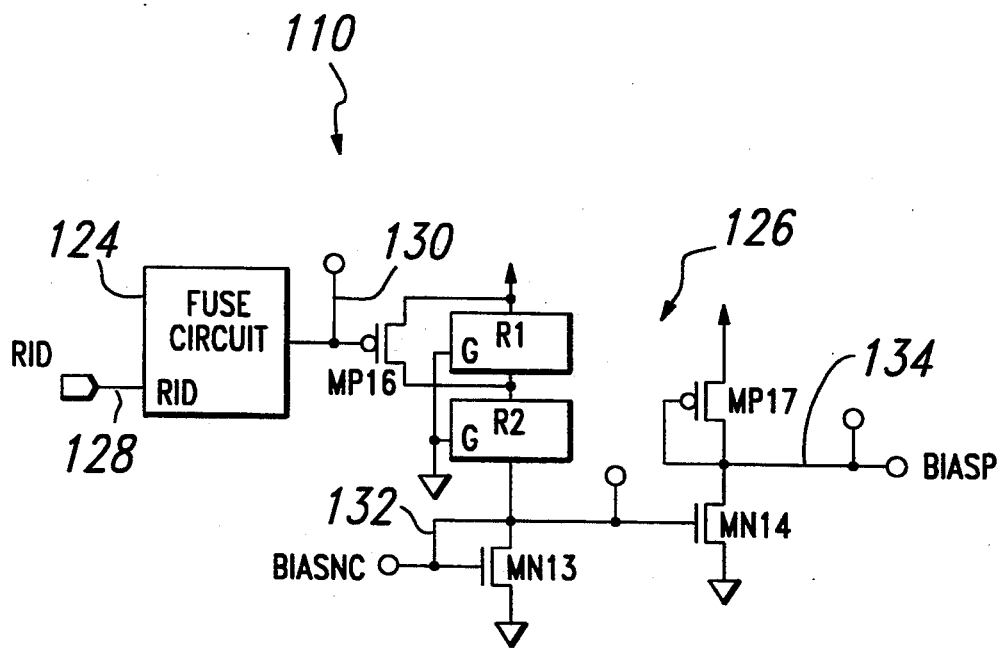
FIG. 3 is a block and schematic diagram of the bias voltage circuit of FIG. 2.

In FIG. 3, bias voltage circuit 110 comprises fuse circuit 124 and bias circuit 126. Fuse circuit 124 receives the power up signal RID on lead 128 and produces its output LPOSC2U on lead 130.

The bias circuit 126 receives the output of the fuse circuit 124 on lead 130 and at the gate of transistor mp16. Bias circuit 126 provides a series connection of a resistance R1, a resistance R2 and transistor mn13 between Vdd and Vss. Bias circuit 126 also provides a series connection of transistors mp17 and mn14 between Vdd and Vss. The source drain leads of mp16 connect to either side of resistance R1. Node 132 connects between resistance R2 and transistor mn13 and the gate of transistor mn14 to form one of the set of bias voltages BIASNC. Node 134 connects between transistors mp17 and mn14 and to the gate of transistor mp17 to form the other of the set of bias voltages BIASP.

The resistances R1 and R2 limit the current flowing through mn13 and establish the voltage levels of BIASP and BIASNC. By shorting out resistance R1 with transistor mp16, the current flowing through mn13 will increase, forcing BIASNC to rise and BIASP to lower. This provides more switching current to the inverter ring 112 in the oscillator and increases the period and decreases the frequency. The signal LPOSC2U on lead 130 in a low condition shorts out the resistance R1 through transistor mp16. That same signal in a high condition turns off transistor mp16 to maintain resistance R1 in the series circuit.

In FIG. 4, fuse circuit 124 comprises a series connection of transistors mp31, fuse 136 and transistor mn32 between Vdd and Vss. Transistors mp34 and mn35 also extend between Vdd and Vss. The signal rid on lead 128 extends to the gates of transistors mp31 and mn32. Node 138 extends between fuse 136, transistor mn32 and the gates of transistors mp34 and mn35. Transistor mn33 extends between node 138 and Vss. The output of fuse circuit 124 extends from between transistors mp34 and mn35 on lead 130 and extends to the gate of transistor mn33.

This fuse circuit 124 is used to choose the frequency of the oscillator 128 and contains only one fuse 136. The fuse state is set at power up when the rid signal is high. If the fuse is blown, then the signal rid high will force node 138 low, forcing the output LPOSC2U on lead 130 high, indicating that a frequency of 0.5 Megahertz or an oscillator period of 2 microseconds has been chosen. The keeper transistor mn33 will maintain node 138 low due to the output signal being high.

Fuse 136 can be formed as desired in either a blow to make or blow to open configuration. In this embodiment, fuse 136 is formed of polysilicon material that is acted on by laser beam to open a circuit.

If the fuse is not blown, then node 138 will charge back up to Vcc after the signal rid goes low. This will force the output signal LPOSC2U on lead 130 low, indicating that a frequency of 1 Megahertz or an oscillator period of 1 microsecond has been chosen.

In FIG. 5, resistance R1 comprises 6 P channel transistors connected in series and having their gates connected together and to circuit ground Vss.

In FIG. 6, resistance R2 comprises 4 P channel transistors connected in series with their gates connected together and to circuit ground Vss.

Figure 7:
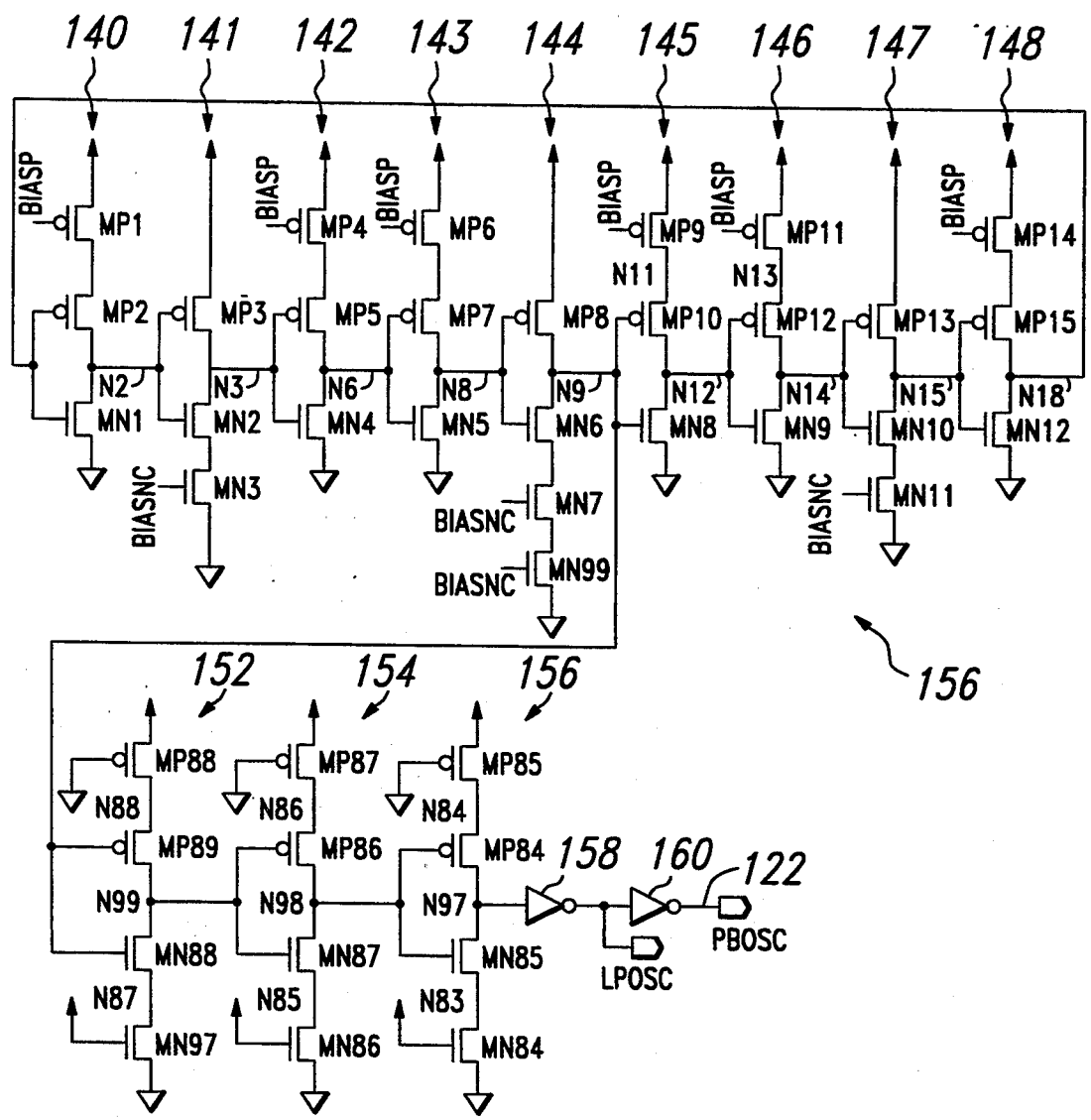
FIG. 7 is a schematic diagram of the oscillator of the invention.

In FIG. 7, inverter ring 112 comprises 9 inverter stages 140–148 having their inputs and outputs connected in a loop, three wave shaping inverter stages 152, 154 and 156 and 2 output inverters 158 and 160.

Inverter stage 140 comprises transistors mp1, mp2 and mn1 connected in series between Vdd and Vss. The gate of transistor mp1 receives the bias voltage BIASP from bias voltage circuit 110. The gates of transistors mp2 and mn1 receive the output of inverter stage 148 on node n18.

Inverter stage 141 comprises transistors mp3, mn2 and mn3 connected in series between Vdd and Vss. The gate of transistor mn3 receives the bias voltage BIASNC. The gates of transistors mp3 and mn2 receive the output of inverter stage 140 on node n2.

Inverter stage 142 comprises transistors mp4, mp5 and mn4 connected in series between Vdd and Vss. The gate of transistor mp4 receives the bias voltage BIASP. The gates of transistors mp5 and mn4 receive the output of inverter stage 141 on node n3.

Inverter stage 143 comprises transistors mp6, mp7 and mn5 connected in series between Vdd and Vss. The gate of transistor mp6 receives the bias voltage BIASP. The gates of transistors mp7 and mn5 receive the output of inverter stage 142 on node n6.

Inverter stage 144 comprises transistors mp8, nm6, mn7 and mn99 connected in series between Vdd and Vss. The gates of transistors of mn7 and mm99 connect to the bias voltage BIASNC. The gates of transistors mp8 and mn6 connect to the output of inverter stage 143 on node n8.

Inverter stage 145 comprises transistors mp9, mp10 and mn8 connected in series between Vdd and Vss. The gate of transistor mp9 receives bias voltage BIASP. The gates of transistors mp10 and mn8 receive the output of inverter stage 144 on node n9.

Inverter stage 146 comprises transistors mp11, mp12 and mn9 connected in series between Vdd and Vss. The gate of transistor mp11 receives bias voltage BIASP. The gates of transistors mp 12 and mn9 receive the output of inverter stage 145 on node n12.

Inverter stage 147 comprises transistors mp13, mn10 and mn11 connected in series between Vdd and Vss. The gate of transistor mn11 receives the bias voltage BIASNC. The gates of transistors mp13 and mn10 receive the output of inverter stage 146 on node n14.

Inverter stage 148 comprises transistors mp14, mp15 and mn12 connected in series between Vdd and Vss. The gate of transistor mp14 receives the bias voltage BIASP. The gates of transistors mp15 and mn12 receive the output of inverter stage 147 on node n15.

The output of inverter ring 112 occurs at node n9 and extends through 3 inverter stages 152, 154 and 156 and 2 inverters 158 and 160 to appear on lead 122.

Inverter 0 stage 152 comprises transistors mp88, mp89, mn88 and mn97 connected in series between Vdd and Vss. The gate of transistor mp88 connects to Vss. The gate of transistor mn97 connects to Vdd. The gates of transistors mp89 and mn88 connect to node n9.

Inverter stage 154 comprises transistors mp87, mp86, mn87 and mn86 connected in series between Vdd and Vss. The gate of transistor mp87 connects to Vss. The gate of transistor mn86 connects to Vdd. The gates of transistors mp86 and mn87 connect to the output of inverter stage 152 on node n99.

Inverter stage 156 comprises transistors mp85, mp84, mn85 and mn84 connected in series between Vdd and Vss. The gate of transistor mp85 connects to Vss. The gate of transistor mn84 connects to Vdd. The gates of transistors mp84 and mn85 connect to the output of inverter stage 154 on node n98.

The input of inverter 158 occurs at the output of inverter stage 156 on node n97. The output of inverter 158 proceeds as the signal LPOSC to the input of inverter 160. The output of inverter 160 occurs on lead 122 as the signal PBOSC.

In operation the inverter ring 112 is a special low power oscillator that uses reference voltages generated in the bias voltage circuit 110. The voltage BIASP is about one threshold voltage of a P channel transistor below Vdd and the voltage BIASNC is about one threshold voltage of an N channel transistor over Vss. The pair of voltages BIASP and BIASNC form a set of bias voltages. These two voltages or the set of bias voltages are used in the inverter chain of the oscillator to control switching current. Control of the switching current in each stage controls the delay through each inverter stage. The operating frequency of the inverter ring can be changed by adjusting the level of the bias voltages.

As mentioned earlier concerning the fuse circuit 124, if the fuse is blown, the inverter ring oscillates at about a 2 microsecond period. If the fuse is not blown, the inverter ring cycles at about a 1 microsecond period. As in all inverter ring oscillators, a high to low transition at the output of any inverter stage propagates through all of the succeeding inverter stages, in inverted form, to appear back at the input of that first inverter stage as a high to low transition, causing the first inverter stage to switch its output. This causes the rippling of high to low and low to high transitions through the inverter ring or ring of inverters at a speed governed by the time it takes each inverter stage to pass the transition received at its input to its output. Controlling of the currents through each inverter stage with the voltages BIASP and BIASNC thus controls the frequency at which the inverter ring or ring of inverters oscillates.

Because the ring of inverters 112 operates at a slow frequency such as having a period of 1 or 2 microseconds, the rise and fall times through the stages are slower than desired for operating the standby charge pumps 102, 104 and self-refresh circuits 106. Inverter stages 152, 154 and 156 therefore are provided to shape the transitions received from the inverter ring 112 and provide voltage swings from close to Vdd to Vss.

The lengths and widths of the transistors used in the disclosed circuits can be as desired while remaining within the scope of the claims. Typical and relative widths and lengths of the channels of the P and N type transistors used in the present embodiment follow.

In FIG. 3, transistor mp16 has a width of 20 and a length of 1.2. Transistor mn13 has a width of 3 and a length of 20. Transistor mp17 has a width of 3 and a length of 20, and transistor mn14 has a width of 3 and a length of 80.

In FIG. 4, transistor mp31 has a width of 5 and a length of 1. Transistor mn32 has a width of 3. Transistor mn33 has a width of 3 and a length of 8. Transistor mp34 has a width of 5, and transistor mn35 has a width of 3 and a length of 1.2.

In FIG. 5, all of the transistors have widths of 3. The input transistor has a length of 47.9, and the output transistor has a length of 58.1. The interior transistors have lengths of 101.

In FIG. 6, all of the transistors have widths of 3. The input transistor has a length of 53 and the output transistor has a length of 245. The two interior transistors have lengths of 106.

In FIG. 7, stage 140 has transistors mp1 with a width of 5 and a length of 8, mp2 with a width of 5 and a length of 1 and mn1 with a width of 5 and a length of 3. Stage 141 has transistors mp3 with a width of 5 and a length of 3 , mn2 with a width of 5 and a length of 1 and mn3 with a width of 5 and a length of 26. Stage 142 has transistors mp4 with a width of 10 and a length of 8, mp5 with a width of 5 and a length of 1 and mn4 with a width of 5 and a length of 3. Stage 144 has transistors mp8 with a width of 5 and length of 3 , mn6 with a width of 5 and a length of 1, mn7 with a width of 10 and a length of 13 and mn99 with a width of 10 and a length of 13.

The disclosed embodiment can be modified and varied while remaining within the scope of the following claims. For example, different sized transistors and different circuits can be used while remaining within one of the goals of improving low power yield by selecting the oscillator frequency after testing and while selecting redundant memory cells. Further, more than one fuse could be used to select one of more than two frequencies for operating the ring oscillator or other types of oscillators.

We claim:

1. A dynamic random access memory part comprising:
    an array of memory cells for storing one data bit in one data cell, the array requiring electrical power and leaking some current, the array of memory cells including redundant cells selected by redundancy fuses after testing of the part to replace defective memory cells;
    peripheral circuits for operating the array of memory cells, the peripheral circuits requiring electrical power at different voltages and leaking some current;
    at least one main charge pump and standby charge pumps supplying the electrical power to the array of memory cells and the peripheral circuits, the standby charge pumps substantially supplying the leakage current to the array and peripheral circuits, the standby charge pumps normally operating at a first frequency and selectively being operated at a certain frequency slower than the first frequency; and
    an oscillator circuit for operating the standby charge pumps at the first and certain frequencies, the oscillator circuit being operable at plural frequencies and including at least one selection fuse for selecting operation of the oscillator at the certain frequency at substantially the same time as selecting the redundant cells in the array.

2. The part of claim 1 in which the oscillator circuit includes a ring of inverter stages operating at one of two frequencies in response to receipt of one of two sets of bias voltages, bias voltage circuits producing a selected one of the two sets of bias voltages by shorting out a resistance in response to receiving one of two selection fuse signals, and a selection fuse circuit producing the selection fuse signals in response to a selection fuse being in a closed or open condition.

3. The part of claim 2 in which the fuse circuit receives a power on reset signal conditioning the selection fuse circuit in a desired state.

4. The part of claim 2 in which the set of bias voltages includes BIASP and BIASNC.

5. The part of claim 1 in which the selection fuse is opened to select the certain frequency.

6. The part of claim 1 in which the first frequency has period of one microsecond and the certain frequency has a period of two microseconds.

7. An oscillator for a dynamic random access memory part, the oscillator comprising:
    a ring of an odd number of inverter stages connected in a loop and each stage operating in response to bias voltages to conduct a pulse around the loop at one frequency in response to receipt of one set of bias voltages and to conduct a pulse around the loop at another frequency in response to receipt of another set of bias voltages; and
    a bias voltage circuit supplying the sets of bias voltages to the ring of inverter stages, the bias voltage circuit including a bias circuit and a fuse circuit that includes a fuse, the bias circuit producing the one and the other sets of bias voltages in response to the fuse being open and closed.

8. The oscillator of claim 7 in which the fuse circuit receives a power on reset signal conditioning the fuse circuit in a desired state.

9. The oscillator of claim 7 in which the set of bias voltages includes BIASP and BIASNC.

10. The oscillator of claim 7 in which the fuse is opened to select the certain frequency.

11. The oscillator of claim 7 in which the one frequency has period of one microsecond and the other frequency has a period of two microseconds.

12. A process of making a dynamic random access memory part, the process comprising the steps of:
    fabricating the part to include redundancy fuses for selecting redundant cells for replacing defective memory cells and to include selection fuses for selecting an operating frequency for standby charge pumps;

testing the part to ascertain the location of defective memory cells and ascertain the location of memory cells passing a pause test and memory cells being within a certain margin of failing the pause test;

affecting the redundancy fuses to select redundant cells for replacing the defective cells and the memory cells that pass the pause test and are within the certain margin of failing the pause test; and affecting the selection fuses to select an operating frequency for operating the standby charge pumps.

13. The process of claim 12 in which affecting the selection fuses to select an operating frequency for operating the standby charge pumps includes blowing a selection fuse.

14. A dynamic random access memory part comprising:

an array of memory cells, the array of memory cells including redundant memory cells for selectably replacing defective array memory cells after fabrication of the part;

peripheral circuits for operating the array of memory cells;

a charge pump for supplying electrical power to the array of memory cells and to the peripheral circuits; and an oscillator with a selectable frequency for determining the power supplied by the charge pump, wherein a frequency of the charge pump is selected in response to the power required for operation of the array of memory cells and the peripheral circuits.

15. The part of claim 14 wherein the oscillator includes at least one fuse, wherein the frequency of the oscillator is determined by a condition of the fuse.

16. A dynamic array random access memory part comprising:

an array of memory cells;

peripheral circuits for operating the array of memory cells;

a charge pump for supplying electrical power to the array of memory cells and to the peripheral circuits; and an oscillator with a selectable frequency for determining the power supplied by the charge pump, wherein a frequency of the oscillator determines the memory cell array refresh rate, the frequency of the oscillator being selected in response the refresh rate required by the array of memory cells.

17. The memory part of claim 16 wherein the oscillator includes at least one fuse, wherein the frequency of the oscillator is determined by a condition of the fuse.

18. The memory part of claim 14 wherein a frequency of the oscillator determines the memory cell array refresh rate, the frequency of the oscillator being selected in response the refresh rate required by the array of memory cells.

19. The memory part of claim 18 wherein the oscillator includes at least one fuse operable after fabrication of the part, wherein the frequency of said oscillator is determined by a condition of the fuse.

20. A process of making a dynamic random access memory part, the process comprising the steps of:

fabricating the part to include redundancy fuses for selecting redundant memory cells for replacing defective memory cells and to include selection fuses for selecting an operating frequency for a charge pump operating an array of memory cells and peripheral circuits for the part;

testing the part to ascertain the location of defective memory cells;

manipulating the redundancy fuses to select redundant cells for replacing the defective cells; and manipulating the selection fuses to select an operating frequency for operating the charge pump.

21. A process of making a dynamic random access memory part, the process comprising the steps of:

fabricating the part to include redundancy fuses for selecting redundant memory cells for replacing selected memory cells and to include selection fuses for selecting an operating frequency for a charge pump operating an array of memory cells and peripheral circuits for the part;

testing the part to ascertain the location of memory cells that are within a certain margin of failing the pause test;

manipulating the redundancy fuses to select memory cells that are within the certain margin of failing the pause test; and manipulating the selection fuses to select an operating frequency for operating the charge pump.

22. The process of claim 21 wherein the selected memory cells include defective memory cells, the process further including the steps of:

prior to the step of manipulating the redundancy fuses and the step of manipulating the selection fuses, testing the part to ascertain the location of defective memory cells; and manipulating the redundancy fuses to select memory cells that are not defective.

* * * * *